United States Patent
Braun

(10) Patent No.: US 10,990,715 B2
(45) Date of Patent: Apr. 27, 2021

(54) SYSTEM SIMULATOR AND METHOD FOR SIMULATING A WIRELESS SYSTEM

(71) Applicant: Rohde & Schwarz GmbH & Co. KG, Munich (DE)

(72) Inventor: Thomas A. Braun, Munich (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 561 days.

(21) Appl. No.: 15/482,879

(22) Filed: Apr. 10, 2017

(65) Prior Publication Data

US 2018/0293338 A1  Oct. 11, 2018

(51) Int. Cl.
*G06N 7/00* (2006.01)
*G06F 30/20* (2020.01)

(52) U.S. Cl.
CPC ..................................... *G06F 30/20* (2020.01)

(58) Field of Classification Search
CPC ........................... G06F 17/5009; H04W 16/18
See application file for complete search history.

(56) References Cited

U.S. PATENT DOCUMENTS

| | | | | |
|---|---|---|---|---|
| 6,571,082 B1* | 5/2003 | Rahman | ............. | H04B 17/0087 342/451 |
| 2003/0043732 A1* | 3/2003 | Walton | .................. | H04L 1/0009 370/208 |
| 2013/0286860 A1* | 10/2013 | Dorenbosch | .......... | H04W 24/06 370/252 |
| 2015/0222507 A1* | 8/2015 | Choy | .................. | H04L 43/0811 370/252 |
| 2016/0373196 A1* | 12/2016 | Stott | .................... | H04B 17/336 |

FOREIGN PATENT DOCUMENTS

WO  2013/163465 A1  10/2013

\* cited by examiner

*Primary Examiner* — Regis J Betsch
*Assistant Examiner* — Jeremy A Delozier
(74) *Attorney, Agent, or Firm* — Westman, Champlin & Koehler, P.A.

(57) ABSTRACT

A system simulator for simulating a wireless system for testing a wireless device under test comprises an uplink signal receiver for receiving an uplink signal generated by the wireless device under test and providing data blocks embedded in the uplink signal, and an uplink signal impairment unit that based on a predetermined probability value sets the data blocks provided by the uplink signal receiver as valid or erroneously received.

16 Claims, 7 Drawing Sheets

SYSTEM SIMULATOR AND METHOD FOR SIMULATING A WIRELESS SYSTEM

TECHNICAL FIELD

The present invention relates to a system simulator for simulating a wireless system for testing a wireless device under test. The present invention further relates to a method for simulating a wireless system.

BACKGROUND

Although applicable in principal to any system that uses wireless data transmission, the present invention and its underlying problem will be hereinafter described in combination with wireless communication systems.

When testing modern wireless devices, like e.g. mobile phones, system simulators may be used that simulate the eco system or surrounding elements that are usually present in a respective wireless system. Such a system simulator may e.g. simulate a base station or eNobeB of a 3GPP network.

Testing the user equipment or device under test is usually performed based on different predetermined test sequences or standard tests. Such tests may e.g. be predetermined by standard regulations or legal requirements.

Thorough testing of a device under test will require functional tests as well as hardware tests. In both cases the test specification may require different conditions of the wireless link between the device under test and the wireless network to be simulated.

Changing conditions may e.g. be simulated by providing different signal to noise ratios for the wireless link between the simulated wireless network and the device under test.

Specific signal-to-noise ratios may e.g. be provided with dedicated signal faders that may comprise analogue signal generators, attenuators and mixers. Such signal faders may be very complex and costly.

Against this background, the problem addressed by the present invention is providing an improved system simulator.

SUMMARY

The present invention solves this object by a system simulator with the features of claim 1, and a method with the features of claim 11.

Accordingly it is provided:
A system simulator for simulating a wireless system for testing a wireless device under test, the system simulator comprising an uplink signal receiver for receiving an uplink signal generated by the wireless device under test and providing data blocks embedded in the uplink signal, and an uplink signal impairment unit that based on a predetermined probability value sets the data blocks provided by the uplink signal receiver as valid or erroneously received.

In addition it is provided:
A method for simulating a wireless system for testing a wireless device under test, the method comprising receiving an uplink signal generated by the wireless device under test, providing data blocks embedded in the uplink signal, and setting the provided data blocks as valid or erroneously received based on a predetermined probability value.

The present invention is based on the finding that fading an analogue signal according to a predetermined signal-to-noise ratio requires complex analogue circuits involving signal or noise generators and mixers.

The present invention in contrast provides a system simulator that performs fading of the incoming or downlink signals, i.e. the signals provided from the device under test, DUT, to the system simulator, based on stochastics or probabilities.

The invention acknowledges that a predetermined signal-to-noise ratio on the analogue and/or wireless part of the signal path will provide erroneously received signal or data blocks with a predetermined probability or block error rate. This means that every single data block has the same predetermined probability of being erroneously received.

Consequently, the present invention replaces any complex and/or analogue fading mechanism with an uplink signal impairment unit that uses a probabilistic approach.

In the system simulator the signal-to-noise ratio in the wireless uplink from the device under test to the uplink signal receiver under the provided test circumstances will be almost ideal, i.e. very low. Therefore the data blocks will usually be received without errors.

The uplink signal impairment unit of the system simulator will however randomly qualify the data blocks that are received without errors as erroneous based on the predetermined probability value. This means that on average the uplink signal impairment unit will qualify a percentage of blocks as erroneous that is equal to the predetermined probability value. If for example the predetermined probability value is 30% the uplink signal impairment unit will randomly qualify about 30% of the received blocks as erroneous.

Therefore, with the present invention it is easily possible to simulate the effects of a degraded signal-to-noise ratio in the signal uplink path without the need to provide any complex analogue circuitry.

Further embodiments of the present invention are subject of the further subclaims and of the following description, referring to the drawings.

In a possible embodiment the system simulator may comprise a memory for storing a number, e.g. one or more, of predetermined probability values that each represent a block error rate for a predetermined signal-to-noise ratio. Further the uplink signal impairment unit may use one of the stored predetermined probability values to set data blocks received from the wireless device under test as valid or erroneously received.

The predetermined probability values may be in the range of 0% to 100% or may be in the range of 0 to 1. It is understood that the predetermined probability values may be in any value range as long as the lowest value of the value range represents a probability of 0% and the highest value of the value range represents a probability of 100%. Such a value range may therefore e.g. range from 0 to 255 or the like.

Usually a test will require to perform the test with the device under test at a predetermined signal-to-noise ratio in the downlink, i.e. from the system simulator to the device under test, and in the uplink.

With the memory that stores the block error rates for predetermined signal-to-noise ratios it is therefore easily possible to select the block error rate for a predetermined or required signal-to noise ratio. It is understood, that the term block error rate refers to the rate of erroneously received blocks at a given signal-to-noise ratio.

In a possible embodiment the memory may store at least one mapping of signal-to-noise ratios, e.g. in a given value range, to block error rates, e.g. between 0% and 100%. In addition the uplink signal impairment unit may use from one of the mappings the probability value that corresponds to a predetermined signal-to-noise ratio that is required e.g. for a specific test.

The required signal-to-noise ratio may be predetermined by the test specification and therefore be specifically selected for the respective test. The probability for receiving erroneous blocks with the required signal-to-noise ratio is then provided by the mapping.

The mappings may e.g. be generated in advance or offline. Depending on the simulated system the mappings from signal-to-noise ratio to the block error rate may be different. Therefore, the memory may store a plurality of mappings for different simulated systems.

In a possible embodiment the system simulator may comprise a probability calculation unit, e.g. a microcontroller or a firmware function in a microcontroller, that calculates based on a predetermined signal-to-noise ratio a block error rate as the predetermined probability value for the uplink signal impairment unit.

With the probability calculation unit, instead of looking up the different block error rates for a given signal-to-noise ratio, the block error rate, i.e. the predetermined probability value, may be calculated in real time.

The probability calculation unit may use any type of formula to calculate the predetermined probability value like e.g. a linear equation, any polynomial function of any degree, or the like. In any case for a specific test the function or equation may be specifically selected or determined.

The equations or formulas may also be called fading profiles.

In a possible embodiment, the uplink signal impairment unit may comprise a random number generator that outputs a random number for every data block. Further, the uplink signal impairment unit may set a data block as erroneous if the respective random number is smaller or equal than the predetermined probability value.

It is understood that the random number generator generates the random numbers in the same value range as the predetermined probability values are provided. This means that the random number generator may e.g. provide random numbers ranging from 0% to 100% or from 0 to 1 or any other value range, like e.g. 0 to 255 as long as it is the same value range that is used for the predetermined probability values.

The uplink signal impairment unit uses the generated random numbers to qualify the single data blocks as valid or erroneous, e.g. invalid or erroneously received.

The random number generator together with the block error rate as a basis of the predetermined probability value allow realistically simulating low quality wireless links and will provide the same rate of erroneous or erroneously received data blocks as a real low quality wireless link.

In a possible embodiment the random numbers may be evenly distributed.

It is understood that any other distribution may also be used to generate the random numbers if required by the test setup. By selecting an adequate distribution the behavior of the real system may be mimicked with the system simulator in greater detail.

In a possible embodiment the system simulator may comprise a coefficient calculation unit, e.g. a microcontroller or a function of a firmware of a microcontroller that calculates a fading coefficient.

The fading coefficient may e.g. be a parameter that varies in time and frequency and simulates a time variant signal-to-noise ratio in a real or live system.

By providing the fading coefficient is becomes possible to simulate not only static signal-to-noise ratios in the wireless signal path but also time variant signal-to-noise ratios.

In a possible embodiment the calculation unit may further calculate a variant signal-to-noise value based on the fading coefficient and select the predetermined probability value based on the variant signal-to-noise value.

The formula for the calculation may e.g. be $$\text{SNR value} = (\text{fading coefficient}^2 * (\text{power of the received uplink signal}))/(\text{predetermined signal-to-noise ratio})$$

The predetermined signal-to-noise ratio may be predetermined e.g. by a test specification or the like and the power of the received uplink signal may be measured periodically.

The calculation unit provides the SNR value, e.g. the signal-to-noise value that may then be used by the uplink signal impairment unit to determine the respective predetermined probability value.

With the above features it is possible to provide a time varying fading for the incoming data blocks that realistically simulates a real wireless link with varying signal-to-noise ratios.

In a possible embodiment the uplink signal receiver may comprise a channel decoder subunit that extracts the data blocks from the received uplink signal.

It is understood, that the uplink signal receiver may comprise any other necessary analogue or digital elements, units or devices that are needed to perform the testing with the wireless device under test.

The uplink signal impairment unit may e.g. be arranged after the channel decoder subunit and before the unit following the channel decoder subunit to mark the single data blocks as valid or erroneous. This position may also be referred to as between layer 1 and layer 2 of an OSI layer model.

This allows performing transparent simulation of signal degradation based on low signal-to-noise ratios without any changes to the preceding or following elements in the system simulator.

In a possible embodiment the system simulator may comprise a downlink signal generation unit, which is configured to generate downlink signals that are provided from the system simulator to the wireless device under test. The system simulator may further comprise a test controller that via a respective downlink signal requests from the wireless device under test a retransmission of data blocks set as erroneous by the uplink signal impairment unit.

To fully simulate a wireless system like e.g. a 3GPP system, the system simulator may not only simulate the uplink signal path. Instead the system simulator may also provide a downlink signal path to the wireless device under test.

In a real wireless system data blocks that are not correctly received are usually requested for retransmission.

With the test controller the system simulator may request this retransmission and then analyze the behavior of the wireless device under test.

The system simulator may e.g. comprise analogue and digital elements, like e.g. filters, amplifiers, attenuators, programmable logic elements, like e.g. microcontrollers, (F)PGAs or the like. The uplink signal receiver may e.g. comprise an analogue and a digital stage, wherein the analogue stage may comprise elements like filters and amplifiers to convert the received signal into a digital signal that may then be further processed by digital elements. It is understood, that the uplink signal impairment unit, the probability calculation unit, the random number generator, the coefficient calculation unit and the channel decoder subunit may be implemented as dedicated digital or mixed hardware units or as functions in a firmware of program that is executed in a central processor of the system simulator. The downlink signal generation unit may also comprise a digital data processing stage and an analogue signal processing stage.

BRIEF DESCRIPTION OF THE DRAWINGS

For a more complete understanding of the present invention and advantages thereof, reference is now made to the following description taken in conjunction with the accompanying drawings. The invention is explained in more detail below using exemplary embodiments which are specified in the schematic figures of the drawings, in which.

Figure 1:
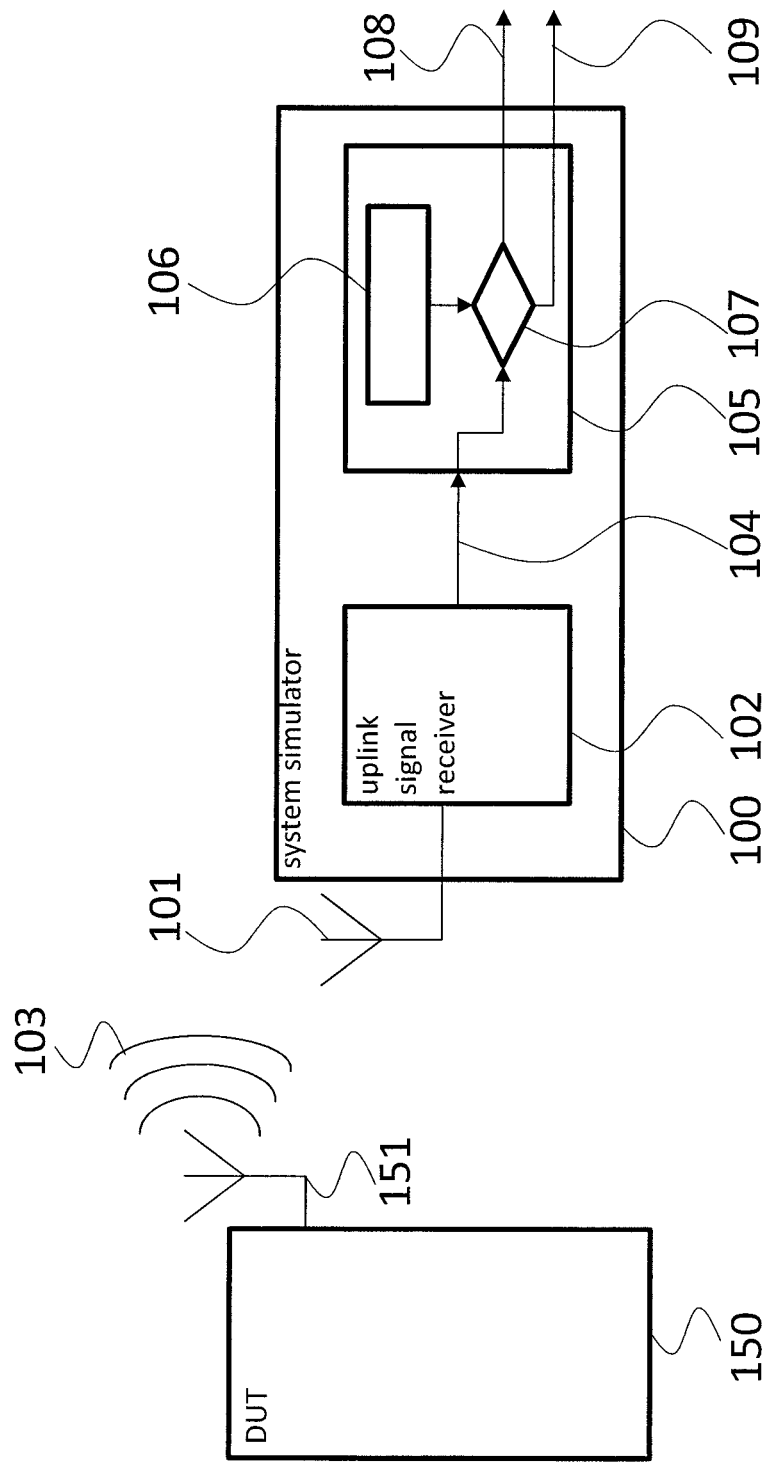
FIG. 1 shows a block diagram of an embodiment of a system simulator according to the present invention.

The appended drawings are intended to provide further understanding of the embodiments of the invention. They illustrate embodiments and, in conjunction with the description, help to explain principles and concepts of the invention. Other embodiments and many of the advantages mentioned become apparent in view of the drawings. The elements in the drawings are not necessarily shown to scale.

In the drawings, like, functionally equivalent and identically operating elements, features and components are provided with like reference signs in each case, unless stated otherwise.

DETAILED DESCRIPTION OF THE DRAWINGS

FIG. 1 shows a block diagram of a system simulator 100. The system simulator 100 serves for simulating a wireless system to test a wireless device under test 150 that emits an uplink signal 103 via an antenna 151.

The system simulator 100 comprises an antenna 101 that is coupled to an uplink signal receiver 102. The uplink signal receiver 102 is coupled to an uplink signal impairment unit 105.

During a test of the wireless device under test 150 the antenna 101 will receive the uplink signal 103 from the wireless device under test 150. The uplink signal receiver 102 will then process the uplink signal 103 to extract data blocks 104 transmitted by the wireless device under test 150 in the uplink signal 103.

The data blocks 104 are then provided to the uplink signal impairment unit 105. The uplink signal impairment unit 105 will qualify the data blocks 104 as valid data blocks 108 or as erroneous data blocks 109 based on a predetermined probability value 106. This means that the probability for a data block 104 to be qualified as erroneous data block 109 is equal to the predetermined probability value 106. If for example the predetermined probability value 106 is 30% the uplink signal impairment unit 105 will qualify about 30% of the data blocks 104 as erroneous data blocks 109. The uplink signal impairment unit 105 comprises an assignment unit 107 that performs the setting of the incoming data blocks 104 as valid data blocks 108 or erroneous data blocks 109.

The uplink signal impairment unit 105 may e.g. be provided between layer 1 and layer 2 if the reception signal path in the system simulator 100 is seen as layered according to the OSI layer model.

In contrast to analogue signal faders, the uplink signal impairment unit 105 may be provided as digital device, like a processor, a programmable logic device, or as computer readable instructions, which may be executed by a controller in the system simulator 100.

This greatly simplifies the simulation of a degradation of the wireless link under test conditions, where in fact the wireless link may be ideal. Instead of providing complex analogue circuitry to simulate a degradation the present invention only requires a simple logic function that may be implemented as firmware of computer executable instructions and is therefore easily adaptable.

Figure 2:
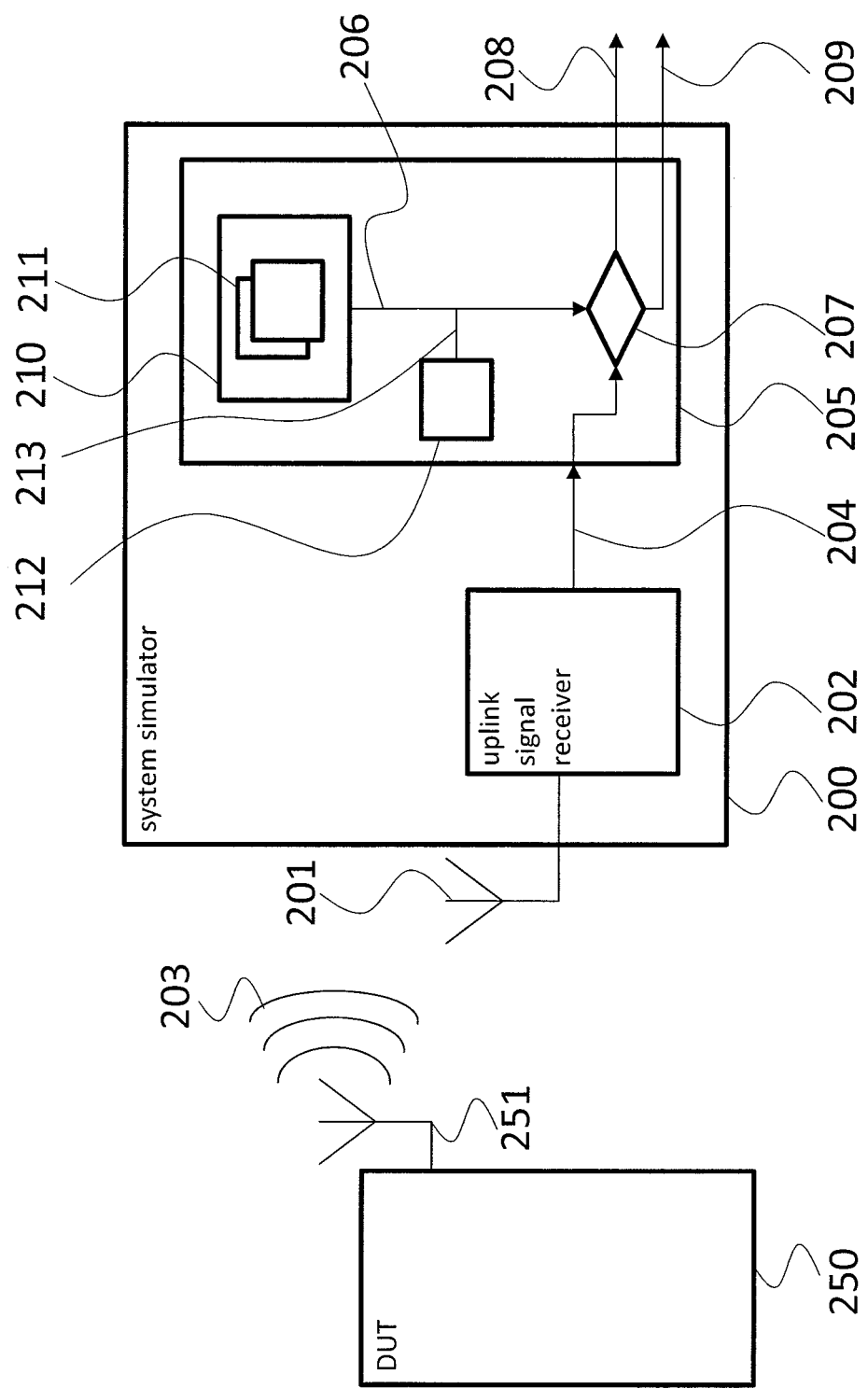
FIG. 2 shows a block diagram of another embodiment of a system simulator according to the present invention.

FIG. 2 shows a block diagram of another system simulator 200. The system simulator 200 is based on the system simulator 100 and comprises similar elements, like an antenna 201, an uplink signal receiver 202 and an uplink signal impairment unit 205.

The uplink signal impairment unit 205 of the system simulator 200 comprises a memory 210 that stores mappings 211 of signal-to-noise ratios to block error rates that may be used as predetermined probability values 206 during operation of the system simulator 200. The predetermined probability value 206 may be chosen from the memory 210 based on a required signal-to-noise ratio. The signal-to-noise ratio may e.g. be predetermined in a test specification.

The uplink signal impairment unit 205 further comprises a random number generator 212 that provides random numbers 213 in the same signal range as the predetermined probability value 206. The random number generator 212 generates a random number 213 for every data block 204 that is provided by the uplink signal receiver 202.

The generated random numbers 213 and the predetermined probability value 206 are provided to the assignment unit 207. The assignment unit 207 compares for every data block 204 the respective generated random number 213 with the predetermined probability value 206. If the generated random number 206 is smaller or equal to the predetermined probability value 206 the assignment unit 207 will qualify a data block 204 as erroneous data block 209. If the generated random number 206 is greater than the predetermined probability value 206 the assignment unit 207 will qualify a data block 204 as valid data block 208.

The result will be that the data blocks 204 will be received in the elements following the uplink signal impairment unit 205 as if they would have travelled a wireless signal path with the signal-to-noise ratio that was the basis for choosing the predetermined probability value 206. That means that the probability for a data block 204 for being erroneous is the same with the uplink signal impairment unit 205 as with a respective wireless signal path.

Figure 3:
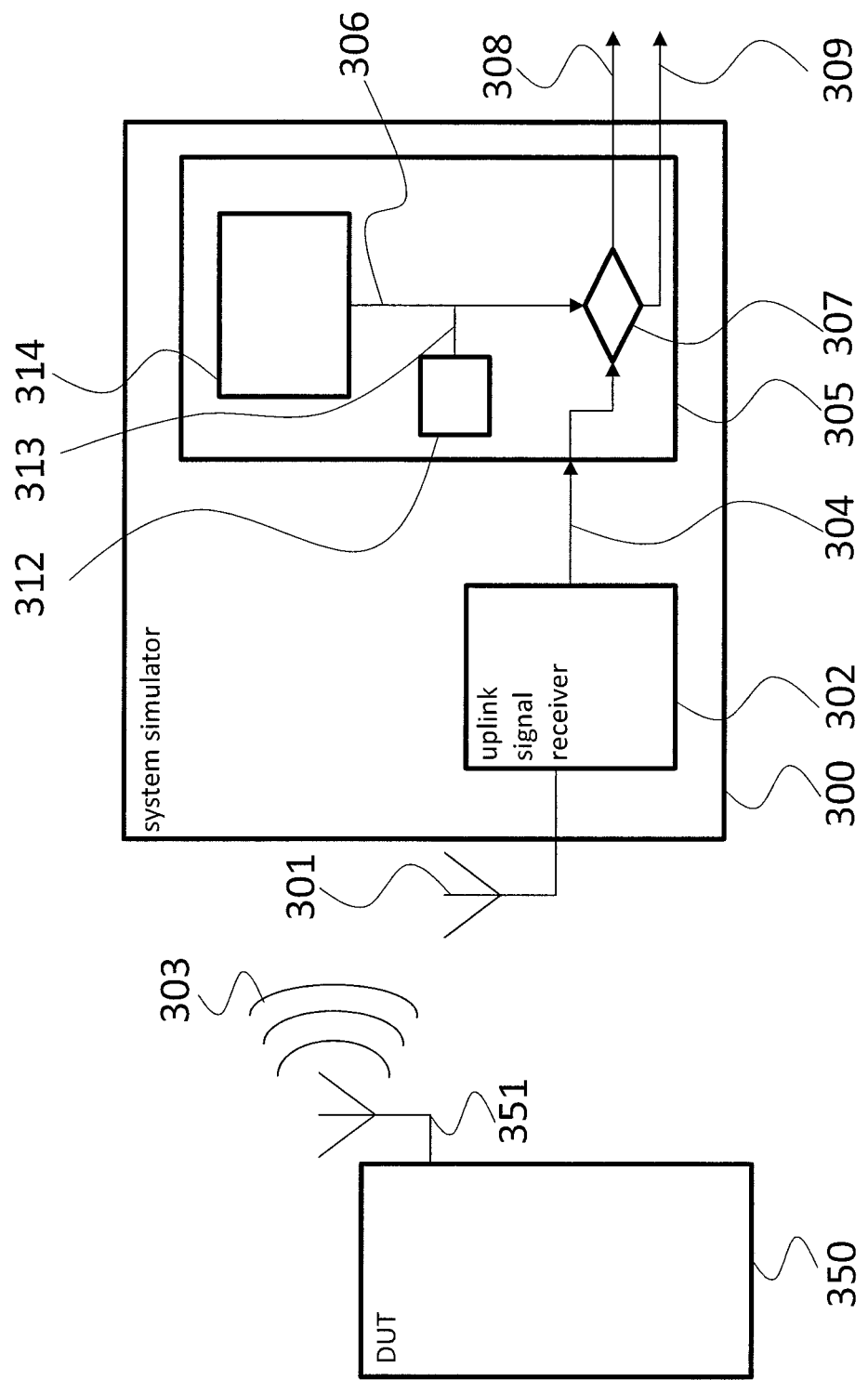
FIG. 3 shows a block diagram of another embodiment of a system simulator according to the present invention.

FIG. 3 shows a block diagram of another system simulator 300. The system simulator 300 is based on the system simulator 200. However, the uplink signal impairment unit 305 of the system simulator 300 comprises a probability calculation unit 314 that calculates the predetermined probability value 306 based on a predetermined equation. Such an equation may e.g. be a linear equation or a polynomial equation of any order.

Instead of providing fixed mappings, like in the embodiment of FIG. 2, with the probability calculation unit 314 the predetermined probability value 306 may be flexibly calculated. Further, the coefficients of the used formula may be adapted flexibly according to the respective application or simulated communication system.

Figure 4:
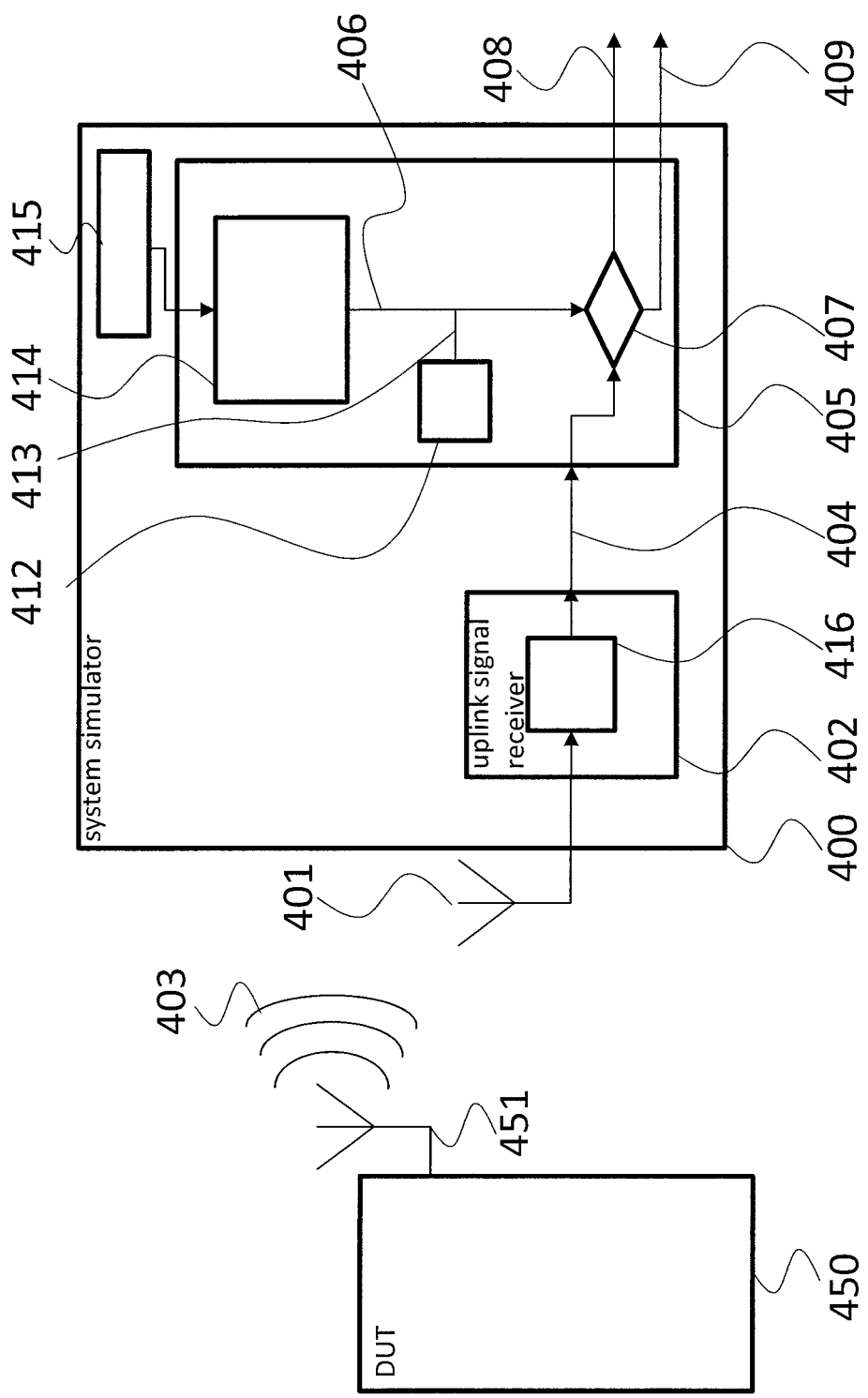
FIG. 4 shows a block diagram of another embodiment of a system simulator according to the present invention.

FIG. 4 shows a block diagram of another system simulator 400 that is based on the system simulator 300. In the system simulator 400 the uplink signal receiver 402 comprises a channel decoder subunit 416 that extracts the data blocks 404 from the uplink signal 403.

In addition, in the system simulator 400 the uplink signal impairment unit 405 also comprises a probability calculation unit 414. However, the probability calculation unit 414 comprises a signal input that is coupled to a coefficient calculation unit 415.

The coefficient calculation unit 415 calculates a fading coefficient that may e.g. be used by the probability calculation unit 414 as basis for calculating the predetermined probability value 406. The coefficient calculation unit 415 may provide the fading coefficient as variant in time and in frequency.

The fading coefficient represents a degradation of the wireless link between the wireless device under test and the system simulator 400 and may vary with time.

Alternatively, the probability calculation unit 414 may require a signal-to-noise ratio as input to select or calculate the corresponding predetermined probability value 306. In this case the coefficient calculation unit 415 may calculate a signal-to-noise value based on the fading coefficient.

The formula for the calculation may e.g. be

SNR value=(fading coefficient^2*(power of the received uplink signal))/(predetermined signal-to-noise ratio)

The predetermined signal-to-noise ratio may be predetermined e.g. by a test specification or the like and the power of the received uplink signal may be measured periodically. It is understood that the signal-to-noise value may also be variant in time and in frequency.

Figure 5:
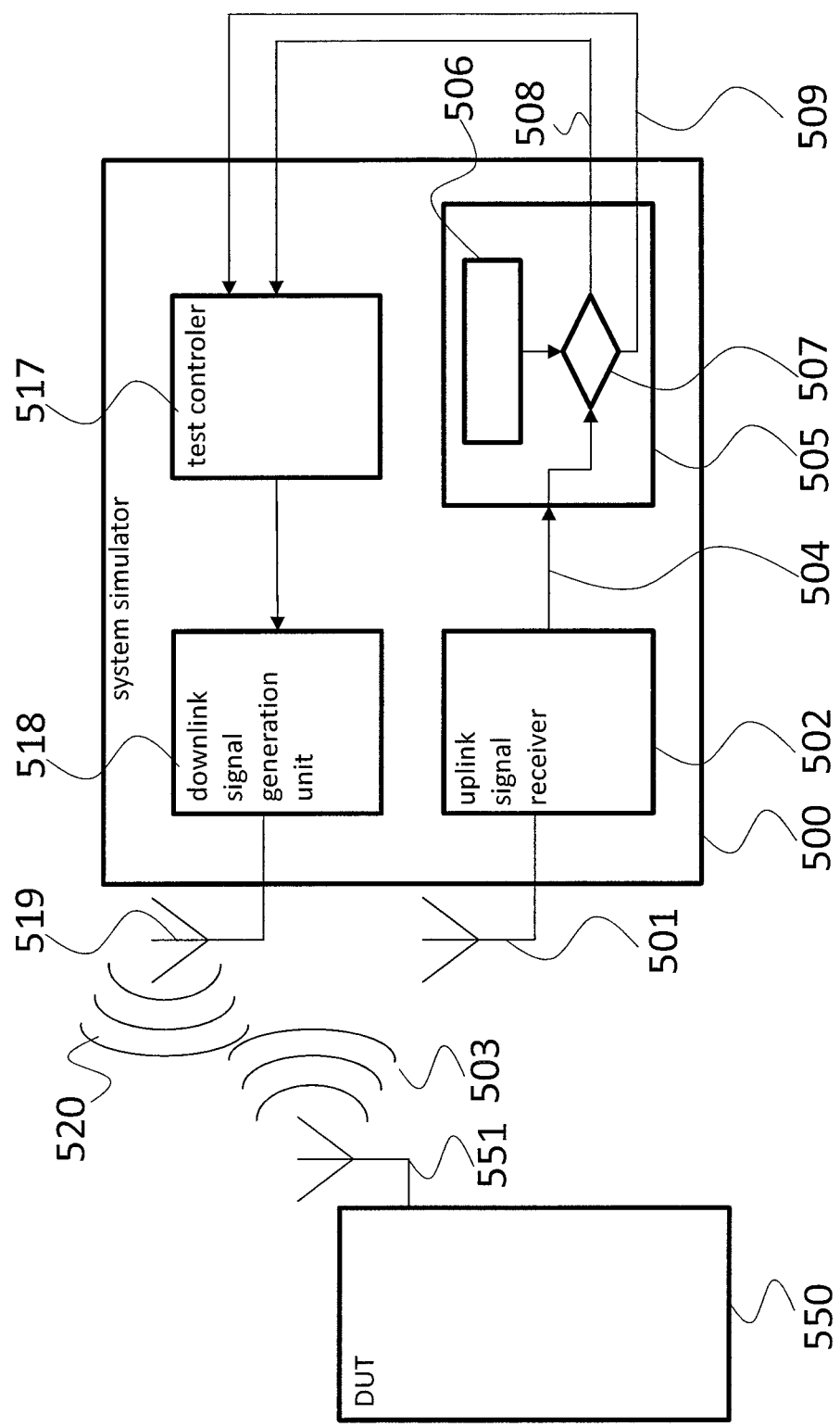
FIG. 5 shows a block diagram of another embodiment of a system simulator according to the present invention.

FIG. 5 shows a block diagram of another system simulator 500. The system simulator 500 is based on the system simulator 100 and further comprises a downlink signal path, i.e. a signal path for sending downlink signals 520 to the wireless device under test 550.

The downlink path comprises a downlink signal generation unit 518 that is connected to an antenna 519 that emits the downlink signals 520. Further, a test controller 517 is provided that at least receives the valid data blocks 508 and the erroneous data blocks 509.

The test controller 517 then generates data that request from the wireless device under test 550 a retransmission of the erroneous data blocks 509.

In FIG. 5 the uplink and the downlink paths are shown as separate paths with separate antennas 501, 519. It is however understood that a single antenna may be provided and that further elements, like analogue filters, attenuators, amplifiers or the like may be shared.

In addition, the test controller 517 may perform any other administrative tasks or control the system simulator 500 according to a predefined test specification.

Although not shown it is understood that any of the system simulators 100-500 may comprise further elements, like e.g. user inputs, display devices, network connections or the like.

Further, elements of the system simulators 100-500 may be freely combined. For example, the coefficient calculation unit 415 may be used with the probability calculation unit 314 or the memory 210.

In the following description of method based FIG. 6 the reference signs used above in the description of the apparatus based FIGS. 1-5 will be used for sake of clarity.

Figure 6:
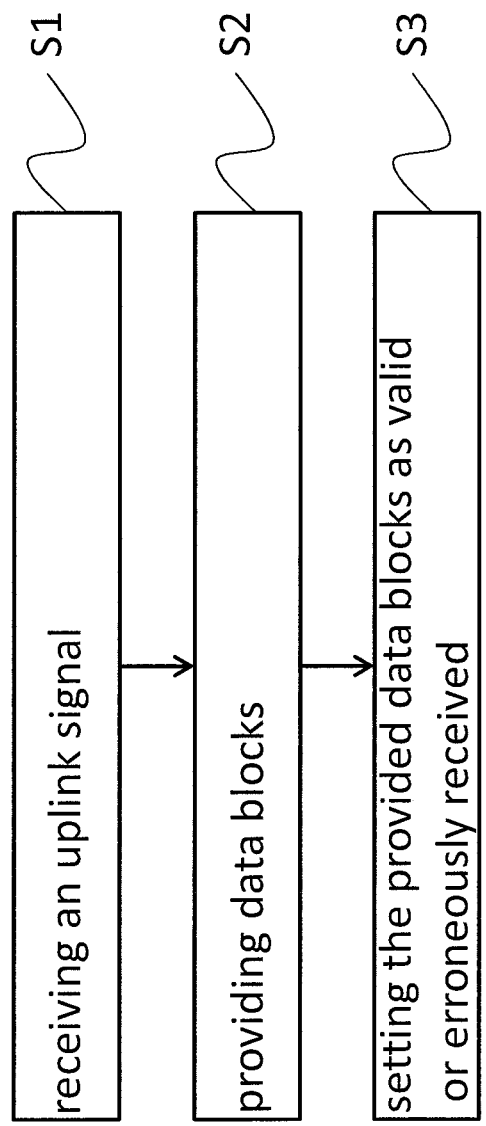
FIG. 6 shows a flow diagram of an embodiment of a method according to the present invention.

FIG. 6 shows a flow diagram of a method for simulating a wireless system for testing a wireless device under test 150, 250, 350, 450, 550.

The method comprises receiving S1 an uplink signal 103, 203, 303, 403, 503 generated by the wireless device under test 150, 250, 350, 450, 550. Further, the method comprises providing or extracting S2 data blocks 104, 204, 304, 404, 504 embedded in the uplink signal 103, 203, 303, 403, 503.

Finally, the method comprises setting S3 the provided data blocks 104, 204, 304, 404, 504 as valid or erroneously received based on a predetermined probability value 106, 206, 306, 406, 506.

The method may further comprise storing a number of predetermined probability values 106, 206, 306, 406, 506 that each represent a block error rate for a predetermined signal-to-noise ratio, and using one of the stored predetermined probability values 106, 206, 306, 406, 506 to set data blocks 104, 204, 304, 404, 504 received from the wireless device under test 150, 250, 350, 450, 550 as valid or erroneously received.

At least one mapping 211 of signal-to-noise ratios to block error rates may be stored. The step of setting S3 as valid or erroneously received may use from one of the mappings 211 the probability value 106, 206, 306, 406, 506 that corresponds to a predetermined signal-to-noise ratio.

The method may further comprise calculating based on a predetermined signal-to-noise ratio a block error rate as the predetermined probability value 106, 206, 306, 406, 506.

The method may further comprise generating a random number 213, 313 for every data block 104, 204, 304, 404, 504, wherein a data block 104, 204, 304, 404, 504 is set as erroneous if the respective random number 213, 313 is smaller than or equal to the predetermined probability value 106, 206, 306, 406, 506. The random numbers 213, 313 may be evenly distributed.

The method may further comprise calculating a fading coefficient and a variant signal-to-noise value based on the fading coefficient and selecting the predetermined probability value 106, 206, 306, 406, 506 based on the variant signal-to-noise value.

Finally, the method may also comprise generating downlink signals 520 that are provided to the wireless device under test 150, 250, 350, 450, 550. With the downlink signals 520 a retransmission of data blocks 104, 204, 304, 404, 504 set as erroneous may be requested from the wireless device under test 150, 250, 350, 450, 550.

Figure 7:
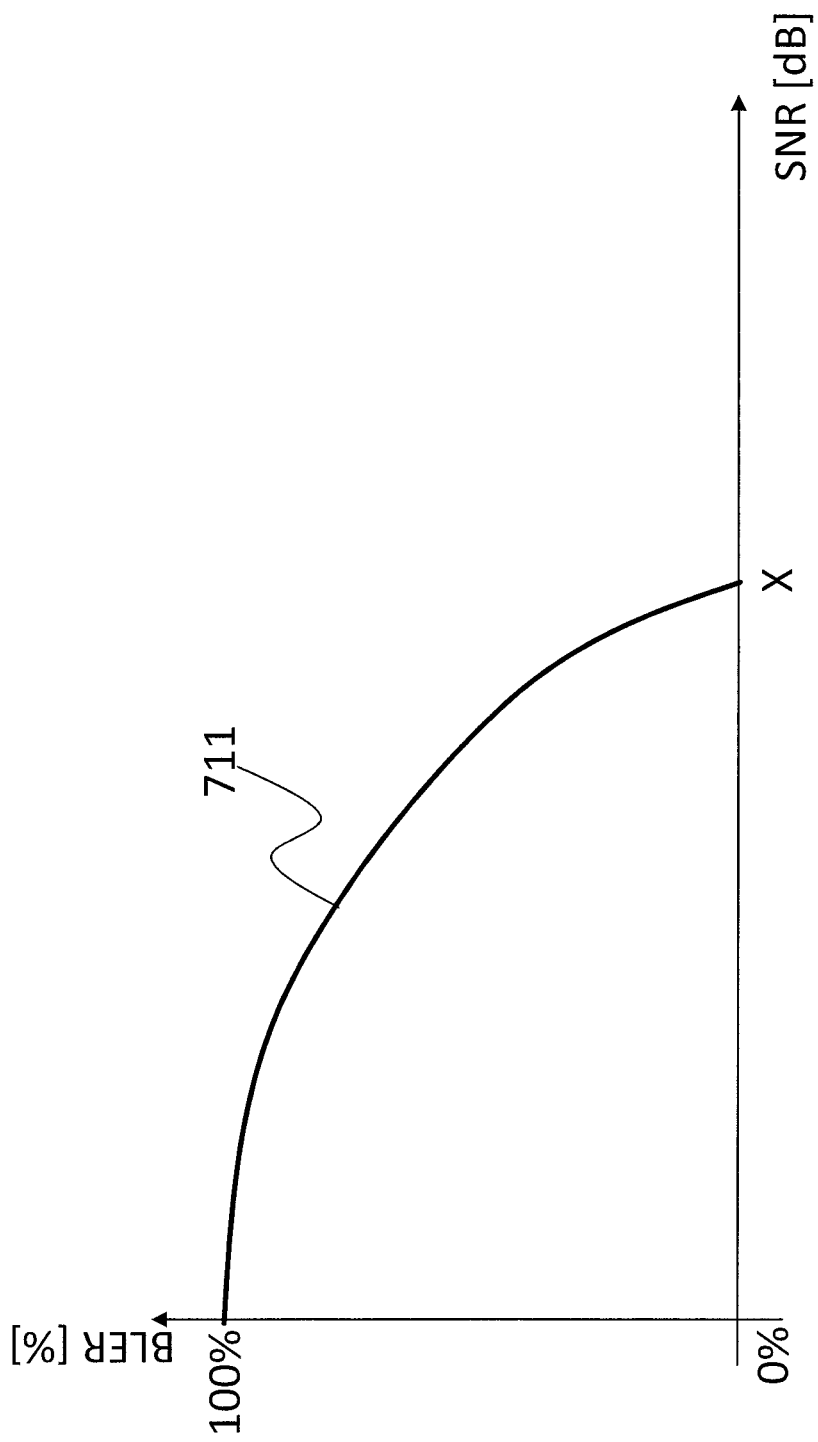
FIG. 7 shows a diagram with a signal-to-noise to block error rate mapping for use with an embodiment of the present invention.

FIG. 7 shows a diagram with a signal-to-noise to block error rate mapping 711 for use with an embodiment of the present invention.

The diagram of FIG. 7 shows the signal-to-noise ratio in dB on the abscissa and the block error rate in % on the ordinate. The mapping has the approximate form of quadratic falling curve starting with a block error rate of 100% at a signal-to-noise ratio of 0 dB and reaching a block error rate of 0% at a defined signal-to-noise ratio of X dB.

The mapping shown in FIG. 7 is just exemplarily presented. It is understood, that depending on the system that should be simulated any other mapping may also be used.

Such mappings may be calculated based on polynomial equations of any order. Alternatively such mappings may be generated e.g. with model based simulations.

Time varying block error rates may be provided based on time varying signal-to-noise ratios by simply selecting the respective block error rate value in each case.

Although specific embodiments have been illustrated and described herein, it will be appreciated by those of ordinary skill in the art that a variety of alternate and/or equivalent implementations exist. It should be appreciated that the exemplary embodiment or exemplary embodiments are only examples, and are not intended to limit the scope, applicability, or configuration in any way. Rather, the foregoing summary and detailed description will provide those skilled in the art with a convenient road map for implementing at least one exemplary embodiment, it being understood that various changes may be made in the function and arrangement of elements described in an exemplary embodiment without departing from the scope as set forth in the appended claims and their legal equivalents. Generally, this application is intended to cover any adaptations or variations of the specific embodiments discussed herein.

In the foregoing detailed description, various features are grouped together in one or more examples or examples for the purpose of streamlining the disclosure. It is understood that the above description is intended to be illustrative, and not restrictive. It is intended to cover all alternatives, modifications and equivalents as may be included within the scope of the invention. Many other examples will be apparent to one skilled in the art upon reviewing the above specification.

Specific nomenclature used in the foregoing specification is used to provide a thorough understanding of the invention. However, it will be apparent to one skilled in the art in light of the specification provided herein that the specific details are not required in order to practice the invention. Thus, the foregoing descriptions of specific embodiments of the present invention are presented for purposes of illustration and description. They are not intended to be exhaustive or to limit the invention to the precise forms disclosed; obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. Throughout the specification, the terms "including" and "in which" are used as the plain-English equivalents of the respective terms "comprising" and "wherein," respectively. Moreover, the terms "first," "second," and "third," etc., are used merely as labels, and are not intended to impose numerical requirements on or to establish a certain ranking of importance of their objects.

| List of reference signs | |
|---|---|
| 100, 200, 300, 400, 500 | system simulator |
| 101, 201, 301, 401, 501 | antenna |
| 102, 202, 302, 402, 502 | uplink signal receiver |
| 103, 203, 303, 403, 503 | uplink signal |
| 104, 204, 304, 404, 504 | data blocks |
| 105, 205, 305, 405, 505 | uplink signal impairment unit |

| List of reference signs (continued) | |
|---|---|
| 106, 206, 306, 406, 506 | predetermined probability value |
| 107, 207, 307, 407, 507 | assignment unit |
| 108, 208, 308, 408, 508 | valid data block |
| 109, 209, 309, 409, 509 | erroneous data block |
| 210 | memory |
| 211, 711 | mapping |
| 212, 312 | random number generator |
| 213, 313 | random number |
| 314, 414 | probability calculation unit |
| 415 | coefficient calculation unit |
| 416 | channel decoder subunit |
| 517 | test controller |
| 518 | downlink signal generation unit |
| 519 | antenna |
| 520 | downlink signal |
| 150, 250, 350, 450, 550 | wireless device under test |
| 151, 251, 351, 451, 551 | antenna |
| S1, S2, S3 | method actions |

The invention claimed is:

1. A system for simulating a wireless system for testing a wireless device, comprising:
    an uplink impairment unit, and an uplink signal receiver for receiving an uplink signal generated by the wireless device and providing a plurality of data blocks embedded in the uplink signal to the uplink impairment unit,
    the uplink impairment unit being a digital device and comprising:
    a memory for storing a number of predetermined probability values that each represent a block error rate for a predetermined signal-to-noise ratio, and
    a random number generator for outputting a random number for each of said plurality of data blocks that is based on one of said number of predetermined probability values,
    an assignment unit for setting each of the plurality of data blocks provided by the uplink signal receiver as valid or erroneously received,
    wherein the assignment unit sets a data block of said plurality of data blocks as erroneously received if the random number corresponding to the data block is smaller or equal than the predetermined probability value,
    wherein the uplink impairment unit forwards the plurality of data blocks to a further element, and
    wherein the data blocks, which are set as erroneously received, are received by the further element as erroneous data blocks, and the data blocks, which are not set as erroneously received, are received by the further element as valid data blocks.

2. The system according to claim 1, wherein the memory stores at least one mapping of signal-to-noise ratios to block error rates, wherein the random number generator uses from one mapping the predetermined probability value that corresponds to the predetermined signal-to-noise ratio.

3. The system according to claim 1, further comprising a probability calculation unit for calculating based on the predetermined signal-to-noise ratio a block error rate as the predetermined probability value for the random number generator.

4. The system according to claim 1, wherein the random numbers for each of said plurality of data blocks are evenly distributed.

5. The system according to claim 1, further comprising a coefficient calculation unit for calculating a fading coefficient.

6. The system according to claim 5, wherein the coefficient calculation unit further calculates a variant signal-to-noise value based on the fading coefficient and selects the predetermined probability value based on the variant signal-to-noise value.

7. The system according to claim 1, wherein the uplink signal receiver comprises a channel decoder subunit that extracts the data blocks from the received uplink signal.

8. The system according to claim 1, further comprising a downlink signal generation unit configured to generate downlink signals provided from the system to the wireless device, and
a test controller that via a respective downlink signal requests from the wireless device under test a retransmission of data blocks set as erroneous by the random number generator.

9. A method for simulating a wireless system for testing a wireless device, comprising:
receiving, by an uplink signal receiver, an uplink signal generated by the wireless device, providing a plurality of data blocks embedded in the uplink signal,
storing a number of predetermined probability values that each represent a block error rate for a predetermined signal-to-noise ratio in a memory,
generating a random number for every data block of said plurality of data blocks by a random number generator, and
setting, by an assignment unit, the provided plurality of data blocks as valid or erroneously received based on the number of predetermined probability values,
wherein a data block of said plurality of data blocks is set as erroneously received if the random number corresponding to each data block is smaller than or equal to the predetermined probability value,
wherein the plurality of data blocks is forwarded to a further element by an unlink impairment unit,
wherein the data blocks, which are set as erroneously received, are received by the further element as erroneous data blocks, and the data blocks, which are not set as erroneously received, are received by the further element as valid data blocks, and
wherein the uplink impairment unit being a digital device comprising at least the random number generator and the assignment unit.

10. The method according to claim 9, wherein at least one mapping of signal-to-noise ratios to block error rates is stored, and
wherein setting the provided plurality of data blocks as valid or erroneously received uses from one of the at least one mappings the predetermined probability value that corresponds to the predetermined signal-to-noise ratio.

11. The method according to claim 9, further comprising calculating based on the predetermined signal-to-noise ratio a block error rate as the predetermined probability value.

12. The method according to claim 9, wherein the random numbers are evenly distributed.

13. The method according to claim 9, further comprising calculating a fading coefficient.

14. The method according to claim 13, further comprising calculating a variant signal-to-noise value based on the fading coefficient and selecting the predetermined probability value based on the variant signal-to-noise value.

15. The method according to claim 9, further comprising extracting the plurality of data blocks from the received uplink signal.

16. The method according to claim 9, further comprising generating downlink signals provided to the wireless device, and
requesting via a respective downlink signal from the wireless device under test a retransmission of the data blocks set as erroneously received.

* * * * *